(12) United States Patent
Speck et al.

(10) Patent No.: US 8,853,669 B2
(45) Date of Patent: Oct. 7, 2014

(54) LIMITING STRAIN RELAXATION IN III-NITRIDE HETERO-STRUCTURES BY SUBSTRATE AND EPITAXIAL LAYER PATTERNING

(75) Inventors: James S. Speck, Goleta, CA (US); Anurag Tyagi, Goleta, CA (US); Steven P. Denbaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 297 days.

(21) Appl. No.: 13/281,775

(22) Filed: Oct. 26, 2011

(65) Prior Publication Data

US 2012/0097919 A1     Apr. 26, 2012

Related U.S. Application Data

(60) Provisional application No. 61/406,876, filed on Oct. 26, 2010.

(51) Int. Cl.
| | |
|---|---|
| H01L 33/16 | (2010.01) |
| H01L 33/12 | (2010.01) |
| H01L 29/04 | (2006.01) |
| H01L 33/00 | (2010.01) |
| B82Y 20/00 | (2011.01) |
| H01S 5/343 | (2006.01) |
| H01S 5/32 | (2006.01) |
| H01L 29/778 | (2006.01) |
| H01L 29/20 | (2006.01) |

(52) U.S. Cl.
CPC ........... H01L 29/045 (2013.01); H01S 2304/12 (2013.01); H01S 5/34333 (2013.01); H01L 33/16 (2013.01); H01L 33/0075 (2013.01); H10S 5/3202 (2013.01); H01S 5/3201 (2013.01); B82Y 20/00 (2013.01); H01L 29/7787 (2013.01); H01L 29/2003 (2013.01)
USPC .................... 257/13; 257/12; 257/94; 257/76; 257/615; 438/46; 438/47; 438/39

(58) Field of Classification Search
USPC .................. 257/76, 12, 13, 14, 94, 103, 615; 438/39, 41, 46, 47
See application file for complete search history.

(56) References Cited

U.S. PATENT DOCUMENTS

| | | | |
|---|---|---|---|
| 6,165,874 | A | 12/2000 | Powell et al. |
| 2003/0102469 | A1 | 6/2003 | Jones et al. |

(Continued)

FOREIGN PATENT DOCUMENTS

WO        2010/041657        4/2010

OTHER PUBLICATIONS

International Search Report dated Mar. 8, 2012 for PCT application No. PCT/US2011/057811 filed on Oct. 26, 2011.

(Continued)

Primary Examiner — Matthew W Such
Assistant Examiner — Scott Stowe
(74) Attorney, Agent, or Firm — Gates & Cooper LLP (57) ABSTRACT

A method of fabricating a substrate for a semipolar III-nitride device, comprising patterning and forming one or more mesas on a surface of a semipolar III-nitride substrate or epilayer, thereby forming a patterned surface of the semipolar III-nitride substrate or epilayer including each of the mesas with a dimension l along a direction of a threading dislocation glide, wherein the threading dislocation glide results from a III-nitride layer deposited heteroepitaxially and coherently on a non-patterned surface of the substrate or epilayer.

26 Claims, 6 Drawing Sheets

(56) References Cited

U.S. PATENT DOCUMENTS

| | | |
|---|---|---|
| 2003/0213964 A1 | 11/2003 | Flynn et al. |
| 2004/0079959 A1 | 4/2004 | Udagawa |
| 2008/0003786 A1 | 1/2008 | Xu et al. |
| 2010/0219416 A1 | 9/2010 | Farrell et al. |
| 2010/0260224 A1 | 10/2010 | Yoshizumi et al. |
| 2010/0264460 A1 | 10/2010 | Grandusky et al. |
| 2011/0292957 A1 | 12/2011 | Bhat et al. |
| 2012/0091465 A1* | 4/2012 | Krames et al. .............. 257/76 |
| 2012/0100650 A1 | 4/2012 | Speck et al. |

OTHER PUBLICATIONS

Kucharski, R. et al., "Nonpolar GaN substrates grown by ammonothermal method," Applied Physics Letters 95, 131119 (2009).

Matthews, J. et al., "Defects in epitaxial multilayers," Journal of Crystal Growth 32 (1976) 265-273.

Tyagi, A. et al., "Partial strain relaxation via misfit dislocation generation at heterointerfaces in (Al,In)GaN epitaxial layers grown on semipolar (1122) GaN free standing substrates," Applied Physics Letters 95, 251905 (2009).

Young, E. et al., "Lattice tilt and misfit dislocations in (1122) semipolar GaN heteroepitaxy," Applied Physics Express 3 (2010) 011004.

Hirai, A. et al., "Formation and reduction of pyramidal hillocks on m-plane {1100} GaN", Applied Physics Letters 91, 191906 (2007).

Lin, Y. et al., "Blue-Green InGaN/GaN Laser Diodes on Miscut m-Plane GaN Substrate", Aplied Physics Express 2 (2009) 082102.

Perlin, P. et al., "Nitride-based quantum structures and devices on modified GaN substrates", Phys. Status Solidi A 206, No. 6, 1130-1134 (2009) / DOI 10.1002/pssa.200880911.

Romanov, A. et al., "Basal plane misfit dislocations and stress relaxation in III-nitride semipolar heteroepitaxy", Journal of Applied Physics 109, 103522 (2011).

Tachibana, K. et al., "Direct observation of uniform optical properties from microphotoluminescence mapping of InGaN quantum wells grown on slightly misoriented GaN substrates", Phys. Stat. Sol. (c) 5, No. 6, 2158-2160 (2008) / DOI 10.1002/pssc.200778500.

Tachibana, K. et al., "Extremely smooth surface morphology of GaN-based layers on misoriented GaN substrates for high-power blue-violet lasers", Phys. Stat. Sol. (c) 3, No. 6, 1819-1822 (2006) / DOI 10.1002/pssc.200565146.

* cited by examiner

LIMITING STRAIN RELAXATION IN III-NITRIDE HETERO-STRUCTURES BY SUBSTRATE AND EPITAXIAL LAYER PATTERNING

CROSS REFERENCE TO RELATED APPLICATIONS

This application claims the benefit under 35 U.S.C. Section 119(e) of commonly-assigned U.S. Provisional Application Ser. No. 61/406,876 filed on Oct. 26, 2010, by James S. Speck, Anurag Tyagi, Steven P. DenBaars, and Shuji Nakamura, entitled "LIMITING STRAIN RELAXATION IN III-NITRIDE HETEROSTRUCTURES BY SUBSTRATE AND EPITAXIAL LAYER PATTERNING," which application is incorporated by reference herein.

This application is related to co-pending and commonly assigned U.S. Utility patent application Ser. No. 13/281,767, filed on same date herewith, by James S. Speck, Anurag Tyagi, Alexey Romanov, Shuji Nakamura, and Steven P. DenBaars, entitled "VICINAL SEMIPOLAR III-NITRIDE SUBSTRATES TO COMPENSATE TILT FO RELAXED HETERO-EPITAXIAL LAYERS,", which application claims the benefit under 35 U.S.C. Section 119(e) of commonly-assigned Provisional Patent Application Ser. No. 61/406,899, filed on Oct. 26, 2010, by James S. Speck, Anurag Tyagi, Alexey Romanov, Shuji Nakamura, and Steven P. DenBaars, entitled "VICINAL SEMIPOLAR III-NITRIDE SUBSTRATES TO COMPENSATE TILT FO RELAXED HETERO-EPITAXIAL LAYERS,", which application is incorporated by reference herein.

BACKGROUND OF THE INVENTION

1. Field of the Invention

This invention relates to a method to limit strain relaxation of hetero-epitaxial III-nitride layers grown on III-nitride substrate/epilayers, by patterning said substrate/epilayer.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

In spite of numerous advantages offered by growth of optoelectronic devices on nonpolar/semipolar III-nitride substrates, misfit dislocation (MD) formation at misfitting heterointerfaces [1, 2] can make it difficult for device manufacturers to fully realize the expected inherent advantages. For semipolar III-nitride based devices, stress relaxation via glide of pre-existing threading dislocations can limit the composition/thickness of strained heteroepitaxial films that can be grown coherently on underlying substrates/films. This can, in turn, limit the device design space e.g. the range of emission wavelength for Light Emitting Diodes (LEDs)/Laser Diodes (LDs).

Additionally, performance for LDs can be affected due to poor optical waveguiding provided by thinner/lower composition waveguiding (typically InGaN) and cladding layers (typically AlGaN). The present invention provides a way to limit the stress-relaxation by the above mentioned glide process, and thus reduces the constraints on device design space, allowing employment of thicker/higher composition strained III-nitride alloy epitaxial layers. The proposed devices can be used as an optical source for various commercial, industrial, or scientific applications. These nonpolar or semipolar nitride LEDs and diode lasers can be expected to find utility in the same applications as c-plane nitride LEDs and diode lasers. These applications include solid-state projection displays, high resolution printers, high density optical data storage systems, next generation DVD players, high efficiency solid-state lighting, optical sensing applications, and medical applications.

SUMMARY OF THE INVENTION

The disclosed invention provides a method to limit strain relaxation of hetero-epitaxial III-nitride layers grown on III-nitride substrate/epilayers, by patterning said substrate/epilayer. The present invention further includes growth and fabrication of devices on patterned III-nitride substrates.

To overcome the limitations in the prior art described above, and to overcome other limitations that will become apparent upon reading and understanding the present specification, the present invention describes a semipolar or nonpolar III-nitride device, comprising a semipolar or nonpolar III-nitride substrate or epilayer having a threading dislocation density of $10^6$ cm$^{-2}$ or more; and a heterostructure, comprising semipolar or nonpolar III-nitride device layers, grown on the substrate or epilayer, wherein the heterostructure has a misfit dislocation density of $10^4$ cm$^{-2}$ or less.

The semipolar or nonpolar III-nitride substrate or epilayer can comprise one or more mesas with a dimension l along a direction of a threading dislocation glide, thereby forming a patterned surface of the semipolar or nonpolar III-nitride substrate or epilayer, wherein the heterostructure is grown heteroepitaxially and coherently on the patterned surface.

The dimension l can be between 10 micrometers and 1 millimeter.

At least one of the heterostructure's layers can have a different III-nitride composition from the semipolar or nonpolar III-nitride substrate or the epilayer.

A heterointerface between the heterostructure and the patterned surface can include a misfit dislocation density that is reduced by a factor of at least 10, or at least 1000, as compared to a misfit dislocation density resulting from a semipolar or nonpolar III-nitride heterostructure grown heteroepitaxially and coherently on a non-patterned surface of the semipolar or nonpolar III-nitride substrate or epilayer.

One or more of the semipolar or nonpolar III-nitride device layers can be thicker, and have a higher alloy composition, as compared to (1) semi-polar or nonpolar III-nitride device layers that are grown on a non-patterned surface of a semi-polar or nonpolar III-nitride substrate or epilayer, or as compared to (2) semi-polar or nonpolar III-nitride device layers that are grown on a different patterned surface of the semi-polar or nonpolar III-nitride substrate.

The device can comprise a device structure for a non-polar or semi-polar III-nitride Light Emitting Diode (LED) or Laser Diode (LD), wherein the device structure includes the heterostructure and one or more active layers emitting light having a peak intensity at one or more wavelengths corresponding to green wavelengths or longer, or a peak intensity at a wavelength of 500 nm or longer.

The active layers can comprise III-nitride Indium containing layers that are sufficiently thick, and have sufficiently high Indium composition, such that the LED or LD emits the light having the wavelengths.

The device structure can comprise waveguiding and/or cladding layers, comprising III-nitride layers that are sufficiently thick, and having a composition, to function as the waveguiding and/or cladding layers for the LD or LED.

The active layers and the waveguiding layers can comprise one or more InGaN quantum wells with GaN barrier layers, and the cladding layers can comprise one or more periods of alternating AlGaN and GaN layers.

One or more of the semi-polar or non-polar III-nitride device layers can have a thickness greater than a (e.g., Matthews Blakeslee) critical thickness for one or more semi-polar or non-polar III-nitride layers deposited on a non-patterned surface of a semi-polar or non-polar III-nitride substrate or epilayer.

The present invention further discloses a method of fabricating a substrate for a semipolar or non-polar III-nitride device, comprising patterning and forming one or more mesas on a surface of a semipolar or non-polar III-nitride substrate or epilayer, thereby forming a patterned surface of the semipolar III-nitride substrate or epilayer, wherein each of the mesas has a dimension l along a direction of a threading dislocation glide, wherein the threading dislocation glide results from a III-nitride layer deposited heteroepitaxially and coherently on a non-patterned surface of a semi-polar or non-polar III-nitride substrate or epilayer.

A pre-existing threading dislocation density of the III-nitride substrate can be at least $10^5$ cm$^{-2}$ or between $10^5$ and $10^7$ cm$^{-2}$.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

State of the art commercial III-nitride devices are based on coherent growth of hetero-epitaxial films on a III-nitride substrate. As mentioned above, this limits the thickness/composition of strained III-nitride films and limits the device design space. Using higher composition strained epilayers leads to the formation of MDs at heterointerfaces, which can degrade device performance [1]. The current invention provides a work-around to the MD formation process by limiting the glide length of pre-existing Threading Dislocations (TDs).

Nomenclature

GaN and its ternary and quaternary compounds incorporating aluminum and indium (AlGaN, InGaN, AlInGaN) are commonly referred to using the terms (Al,Ga,In)N, III-nitride, Group III-nitride, nitride, $Al_{(1-x-y)}In_yGa_xN$ where $0<x<1$ and $0<y<1$, or AlInGaN, as used herein. All these terms are intended to be equivalent and broadly construed to include respective nitrides of the single species, Al, Ga, and In, as well as binary, ternary and quaternary compositions of such Group III metal species. Accordingly, these terms comprehend the compounds AlN, GaN, and InN, as well as the ternary compounds AlGaN, GaInN, and AlInN, and the quaternary compound AlGaInN, as species included in such nomenclature. When two or more of the (Ga,Al,In) component species are present, all possible compositions, including stoichiometric proportions as well as "off-stoichiometric" proportions (with respect to the relative mole fractions present of each of the (Ga,Al,In) component species that are present in the composition), can be employed within the broad scope of the invention. Accordingly, it will be appreciated that the discussion of the invention hereinafter in primary reference to GaN materials is applicable to the formation of various other (Al,Ga,In)N material species. Further, (Al,Ga,In)N materials within the scope of the invention may further include minor quantities of dopants and/or other impurity or inclusional materials. Boron (B) may also be included.

The term "$Al_xGa_{1-x}$N-cladding-free" refers to the absence of waveguide cladding layers containing any mole fraction of Al, such as $Al_xGa_{1-x}$N/GaN superlattices, bulk $Al_xGa_{1-x}$N, or AlN. Other layers not used for optical guiding may contain some quantity of Al (e.g., less than 10% Al content). For example, an $Al_xGa_{1-x}$N electron blocking layer may be present.

One approach to eliminating the spontaneous and piezoelectric polarization effects in GaN or III-nitride based optoelectronic devices is to grow the III-nitride devices on nonpolar planes of the crystal. Such planes contain equal numbers of Ga (or group III atoms) and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {1-100} family, known collectively as m-planes. Thus, nonpolar III-nitride is grown along a direction perpendicular to the (0001) c-axis of the III-nitride crystal.

Another approach to reducing polarization effects in (Ga,Al,In,B)N devices is to grow the devices on semi-polar planes of the crystal. The term "semi-polar plane" (also referred to as "semipolar plane") can be used to refer to any plane that cannot be classified as c-plane, a-plane, or m-plane. In crystallographic terms, a semi-polar plane may include any plane that has at least two nonzero h, i, or k Miller indices and a nonzero l Miller index.

Technical Description

Figure 1:
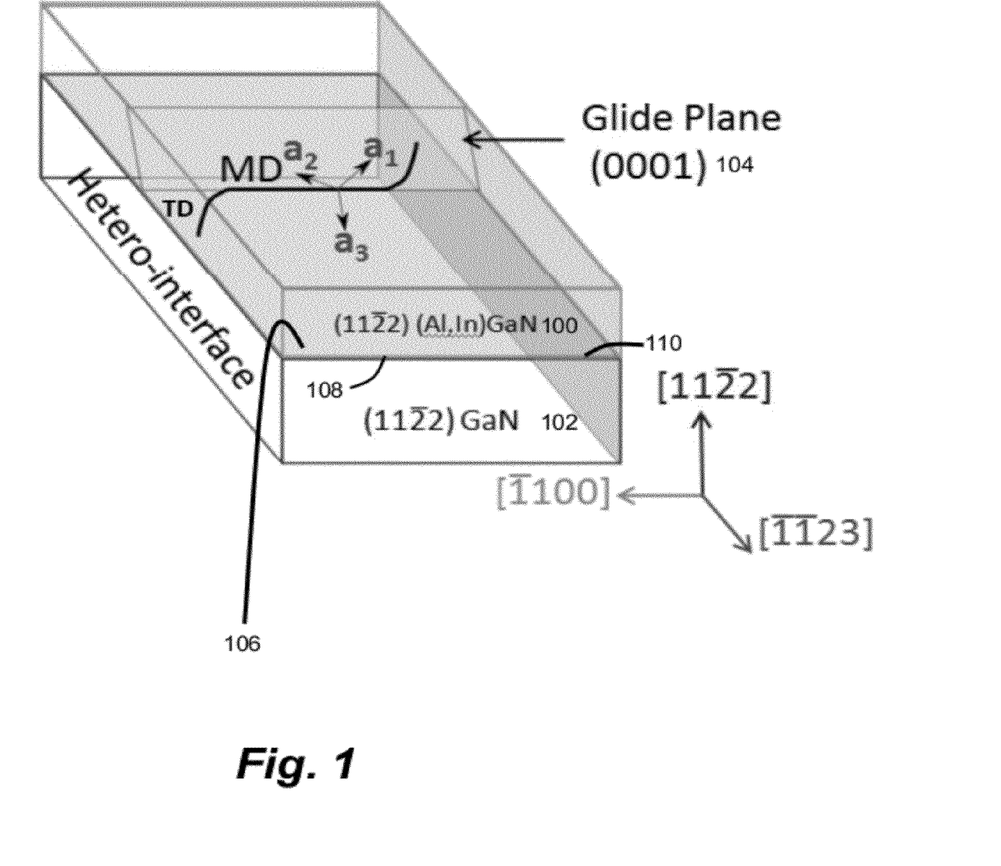
FIG. 1 is a perspective view schematic illustrating MD formation by TD glide for the exemplary case of a strained heteroepitaxial (Al,In)GaN layer grown on a semipolar (11-22) GaN substrate, taken from [1].

For the case of semipolar III-nitride heteroepitaxy, significant stress relaxation can be realized by the glide of pre-existing TDs. FIG. 1 is a perspective view schematic illustrating MD formation by TD glide for the exemplary case of a strained heteroepitaxial (Al,In)GaN layer 100 grown on a semipolar (11-22) GaN substrate 102. The MD line direction corresponds to the intersection of the glide plane 104 (which is (0001) for basal plane slip) and the growth plane 106, which for FIG. 1 corresponds to the in-plane m-axis [1-100]. Also shown is the heterointerface 108 between the (Al,In)GaN layer 100 and the GaN substrate 102, the non-patterned surface 110 of the substrate 102 upon which layer 100 is deposited, and the (11-22) and (1-1-23) directions.

As a simple estimate, the maximum MD density, $\rho_{MD}^{max}$, is given by $$\rho_{MD}^{max} \cong \frac{1}{2}\rho_{TD}l \qquad \text{Equation (1)}$$

where l is the glide length of the TD and $\rho_{TD}$ is the pre-existing TD density. In the absence of any crossing MDs, or other obstacles to glide, l should correspond to the wafer dimensions in the projected glide direction, which for basal slip should correspond to the intersection of the (0001) c-plane 104 and the growth plane 106. Typically, the semipolar GaN substrates 102 are cross-cut from c-plane GaN boules, and the typical wafer dimensions are on the order of 1 cm×1 cm. Thus, $\rho_{MD}^{max} \sim 10^{-6}$ cm$^{-2}$×1 cm=$10^6$ cm$^{-1}$, or the minimum MD spacing is on the order of 100 Angstroms (Å) which corresponds to plastic relaxation of the order of ~2% (the relieved misfit strain accompanying plastic relaxation is given by $f_{misfit}=b_{edge,\parallel}\cdot\rho_{MD}^{MAX}$, where $b_{edge,\parallel}$ is the edge component of the MD Burgers vector that is parallel to the heterointerface 108).

Figure 2:
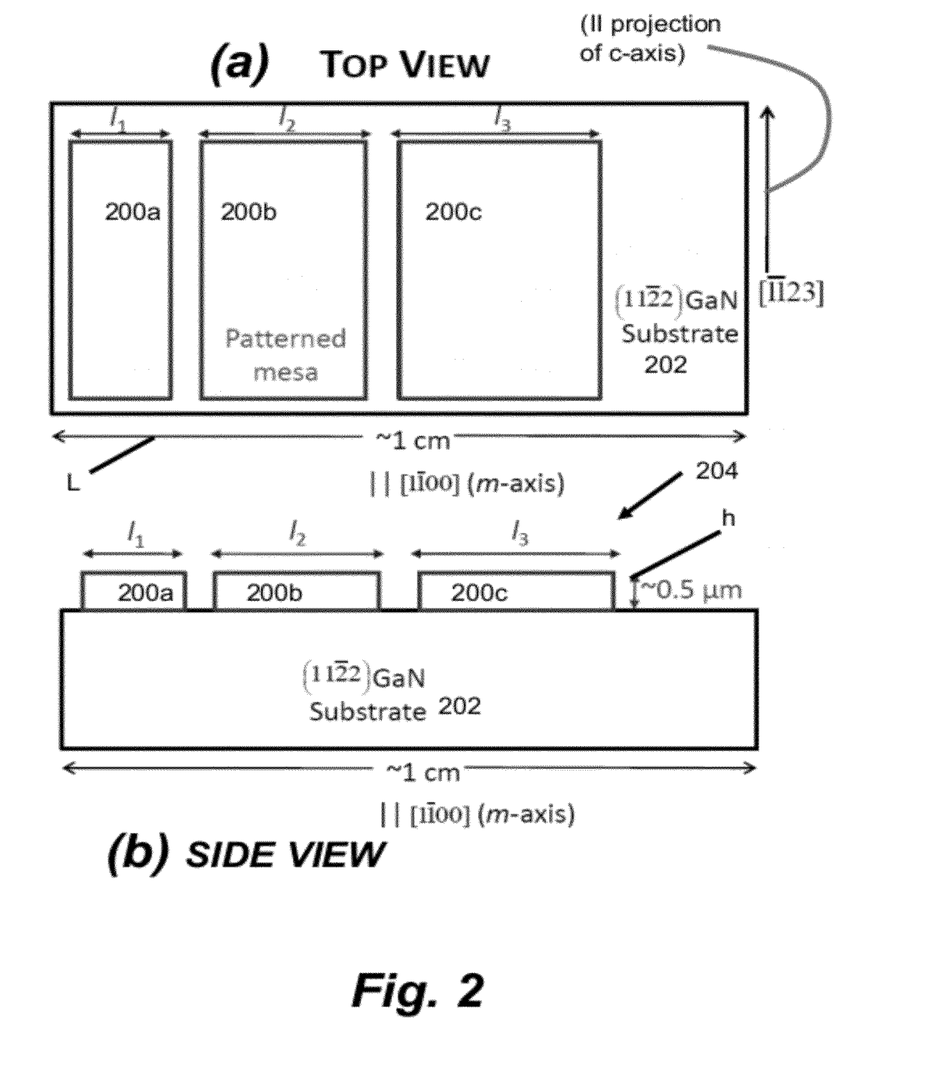
FIG. 2 illustrates a top view (a) and side view (b) of mesas patterned on a substrate or epilayers, according to one or more embodiments of the present invention.

The present invention notes that the MD density, and consequently stress relaxation, has a direct dependence on the run length of the TDs. This enables the present invention to limit stress relaxation by limiting the run/glide length of the TDs. An expedient way to accomplish this is to pattern "mesas" on the substrate/epilayers. This is illustrated in FIGS. 2(a) and 2(b) (again for the exemplary case of (11-22)), wherein mesas 200a, 200b, and 200c are patterned into the surface of the (11-22) GaN substrate 202, to form a patterned surface 204 of the substrate 202. In FIG. 2(a)-(b), $l_1$, $l_2$, and $l_3$ are the mesa dimensions parallel to the TD glide direction (m-axis [1-100], same as MD line direction) for each of the 3 mesas 200a, 200b, and 200c depicted in FIGS. 2(a) and 2(b). Also shown are the height h (~0.5 micrometers) of the mesas 200a-200c, a surface area of the substrate 202 having a length L (~1 centimeter) along the direction of the TD glide direction (parallel ($\parallel$) to the [1-100] m-axis direction which is also shown), and the [-1-123] direction (parallel to the projection of the c-axis).

By using mesa dimensions of ~10 μm to ~1 mm in the TD glide direction, the TD glide length and MD density can be reduced by a factor of ~$10^3$ to ~10, and consequently, only very little misfit relief can be achieved by TD glide. This enables the present invention to grow strained epitaxial layers with higher alloy composition and/or greater thickness without generating a high density of MDs at the misfitting heterointerfaces (MD density due to pre-existing TDs would be limited to $$\frac{1}{2}\rho_{TD}l,$$

where l corresponds to the mesa dimension parallel to the glide direction). As mentioned previously, this enables a wider and more flexible device design space, which translates into improved performance for devices.

Figure 3:
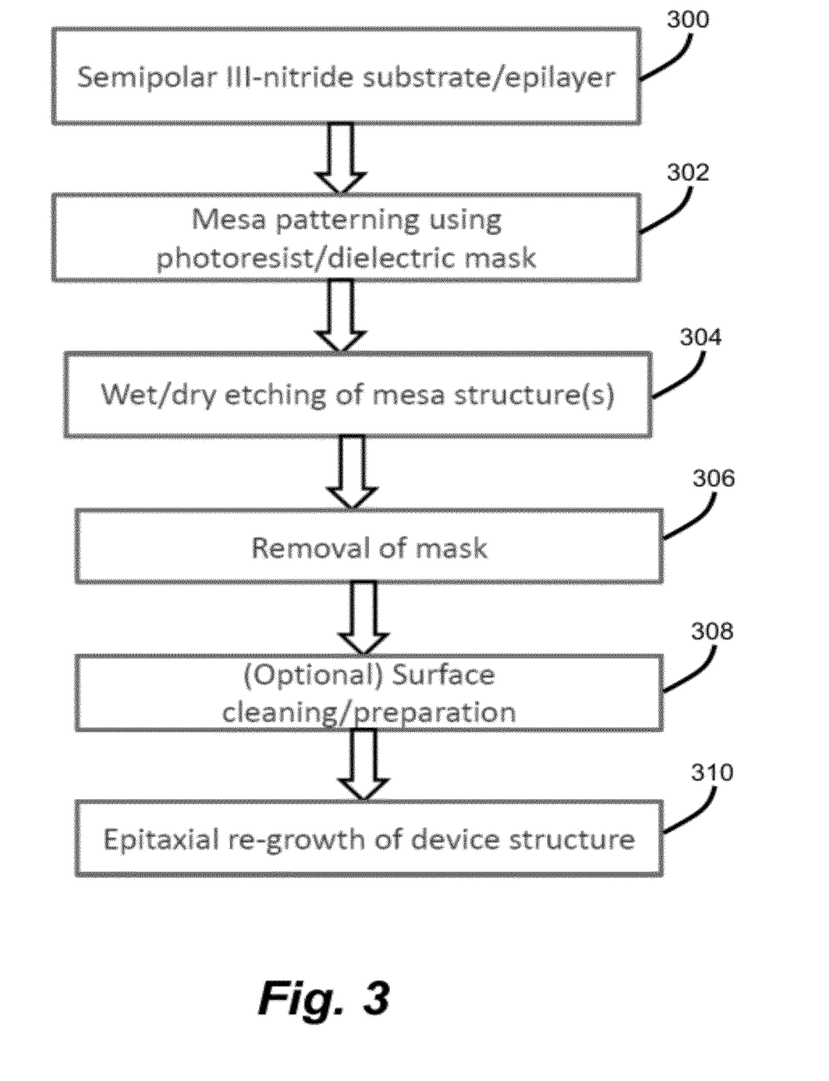
FIG. 3 is a flowchart illustrating a method of fabricating a device, according to one or more embodiments of the present invention.

FIG. 3 is a flow chart outlining the steps involved in one embodiment of the present invention.

The present invention starts with a semipolar III-nitride substrate or epilayer (grown on a substrate), as illustrated in Block 300. The pre-existing TD density for the substrate/epilayer would typically be in the $10^5$-$10^7$ cm$^{-2}$ range.

Block 302 represents mesa patterning, wherein the substrate/epilayer is then covered with a suitable mask (either photoresist or dielectric) having the desired mesa pattern, using conventional lithographic techniques. Although the mesa/mask pattern can take an arbitrary shape, the important dimension is the size of the pattern parallel to the glide direction (l in equation 1) since that determines the maximum MD density (due to pre-existing TDs). The present invention is not limited to patterning using photoresist/dielectric masks (other methods may also be used).

Block 304 represents mesa etching, wherein the substrate/epilayer is then etched to a suitable depth (>50 nm, e.g., 0.1-10 μm are typical etch depths) to form mesa structures, and the mask is subsequently removed (Block 306). The etching can include, but is not limited to, wet or dry etching.

The mesa sidewalls and the field may optionally be covered with a dielectric, and the exposed substrate/epilayer surface may then be subjected to an ex situ or in situ cleaning or preparation, as represented in Block 308, prior to epitaxial re-growth of the device epitaxial structure (Block 310).

Figure 4:
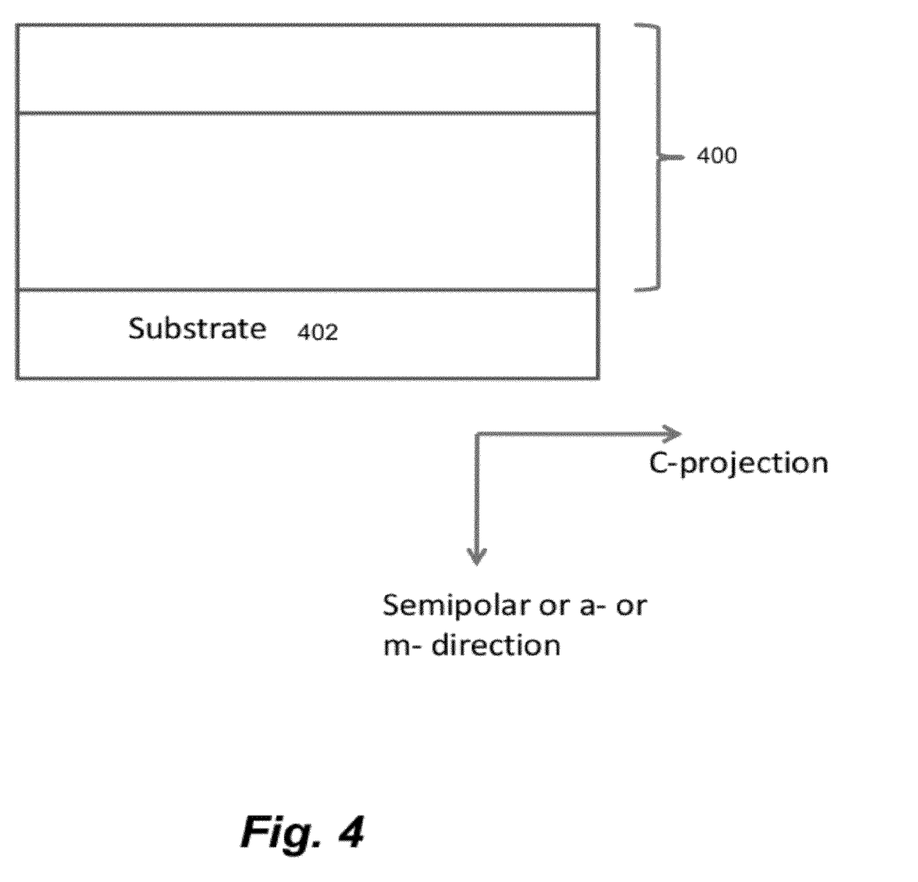
FIG. 4 is a cross-sectional schematic of device heterostructure layers on a III-nitride substrate or epilayer, according to one or more embodiments of the present invention.

FIG. 4 illustrates a III-nitride heterostructure 400 on a substrate or epilayer 402, wherein $\rho_{MD}^{max}\sim\rho_{TD}l$ and strain relaxation ($\in^{relax}$) in the heterostructure layers is $\in^{relax}=\rho_{MD}\cdot b_{edge\parallel}$, and the c-projection direction and the semipolar a- or m-direction are also shown.

Figure 5:
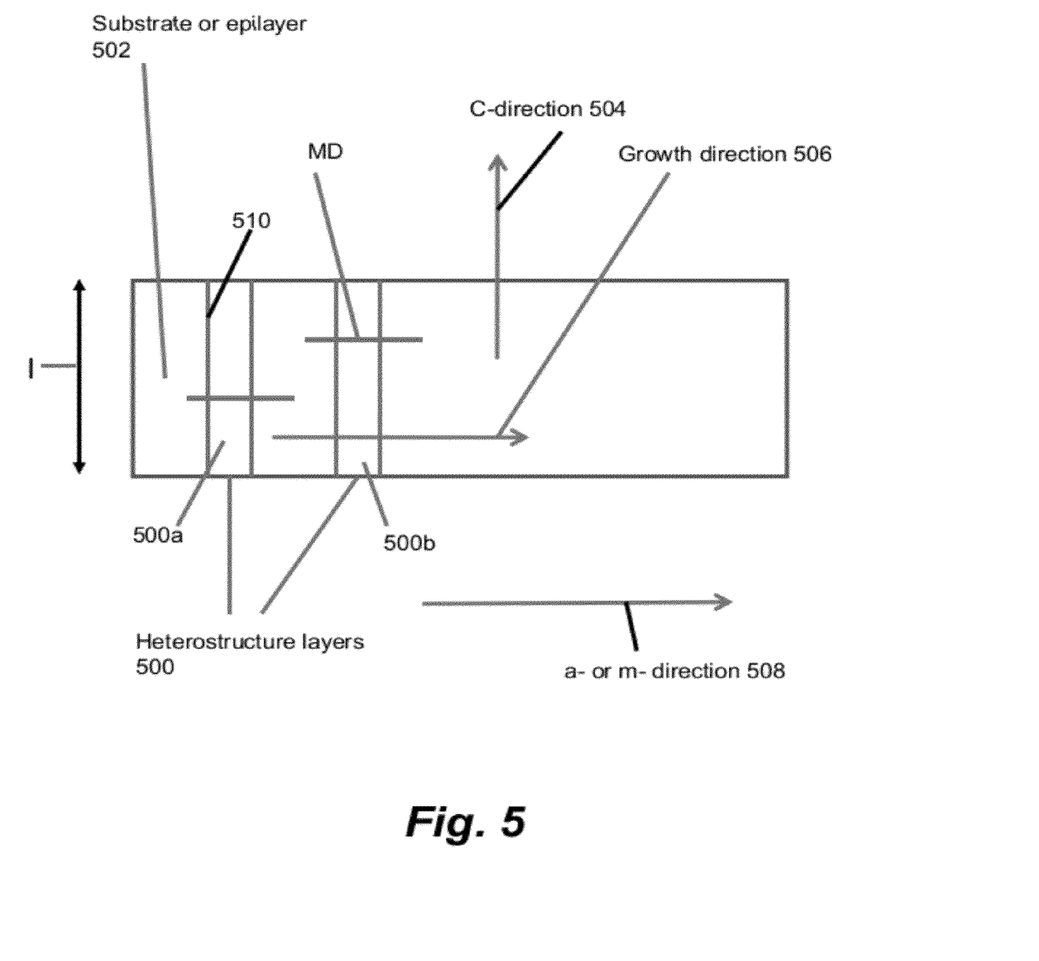
FIG. 5 is a cross-sectional schematic of device heterostructure layers on a non-polar III-nitride substrate or epilayer, according to one or more embodiments of the present invention.

FIG. 5 illustrates limiting strain relaxation in non-polar III-nitride heterostructures (comprising heterostructure layers 500) by substrate patterning of a non-polar substrate 502 or epilayer. Also shown are MDs, the c-direction 504 of the III-nitride, the growth direction 506 of the heterostructure layers 500, and the m- or a-direction 508 of the III-nitride. An l=1 cm wide wafer or substrate 502 with $10^6$ cm$^{-2}$ TDs, leads to $10^6$ MDs/cm$^2$ using the relation $\rho_{MD}^{max}\sim\rho_{TD}l$. If l is reduced to 100 micrometers or $10^{-2}$ cm, the MD density can be reduced to $10^4$ MDs/cm$^2$.

Device Embodiments

FIG. 1(a)-(b), FIG. 2(a)-(b), FIG. 5, and FIG. 6, illustrate various device embodiments.

FIG. 5 illustrates a semipolar or nonpolar III-nitride substrate 502 or epilayer having a threading dislocation density of $10^6$ cm$^{-2}$ or more; and one or more semipolar or nonpolar III-nitride layers 500a, 500b, such as device layers (or a heterostructure 500, comprising semipolar or nonpolar III-nitride layers or device layers 500a, 500b), grown (e.g., coherently and/or heteroepitaxially) on the semipolar or nonpolar III-nitride substrate 502 or epilayer, wherein the heterostructure 500 or layers 500a, 500b have a misfit dislocation density of $10^4$ cm$^{-2}$ or less.

The substrate 502, 202 can be bulk III-nitride or a film of III-nitride. The substrate can comprise an initial semi-polar III-nitride (e.g., template) layer or epilayer 502, 202 grown on a substrate (e.g., heteroepitaxially on a foreign substrate, such as sapphire, spinel, or silicon carbide).

FIG. 2(a), FIG. 2(b), and FIG. 5 illustrate the semipolar or nonpolar III-nitride substrate 202, 502 or epilayer can comprise one or more mesas 200a with a dimension l along a direction of a threading dislocation glide, thereby forming a patterned surface 204 of the semipolar or nonpolar III-nitride substrate or epilayer 502, 202 (the surface 204 of the substrate comprises the mesas 200a-c). The heterostructure 500 or layers 500a-b are grown heteroepitaxially and/or coherently on the patterned surface 204.

The threading dislocation glide typically results from a nonpolar or semipolar III-nitride layer 100 of the heterostructure deposited heteroepitaxially and coherently on a non-patterned surface 110 of a nonpolar or semipolar III-nitride substrate 102 or epilayer (see FIG. 1). The use of the patterned surface 204 can reduce or eliminate the amount of threading dislocation glide.

The dimension 1 can be, but is not limited to, between 10 micrometers and 1 millimeter. The mesas 200a can have a variety of shapes, including, but not limited to, square or rectangular shapes (as viewed from the top).

At least one of the layers 500a-b can have a different III-nitride composition from the nonpolar or semipolar III-nitride substrate 502 or the epilayer.

A heterointerface 510 between the heterostructure 500, or layers 500a-b, and the patterned surface 204 can include a misfit dislocation (MD) density that is reduced by a factor of at least 10, or at least 1000, as compared to a misfit dislocation density resulting from a semipolar or nonpolar III-nitride heterostructure 100 grown heteroepitaxially and/or coherently on a non-patterned surface 110 of the nonpolar or semipolar III-nitride substrate or epilayer 102.

Figure 6:
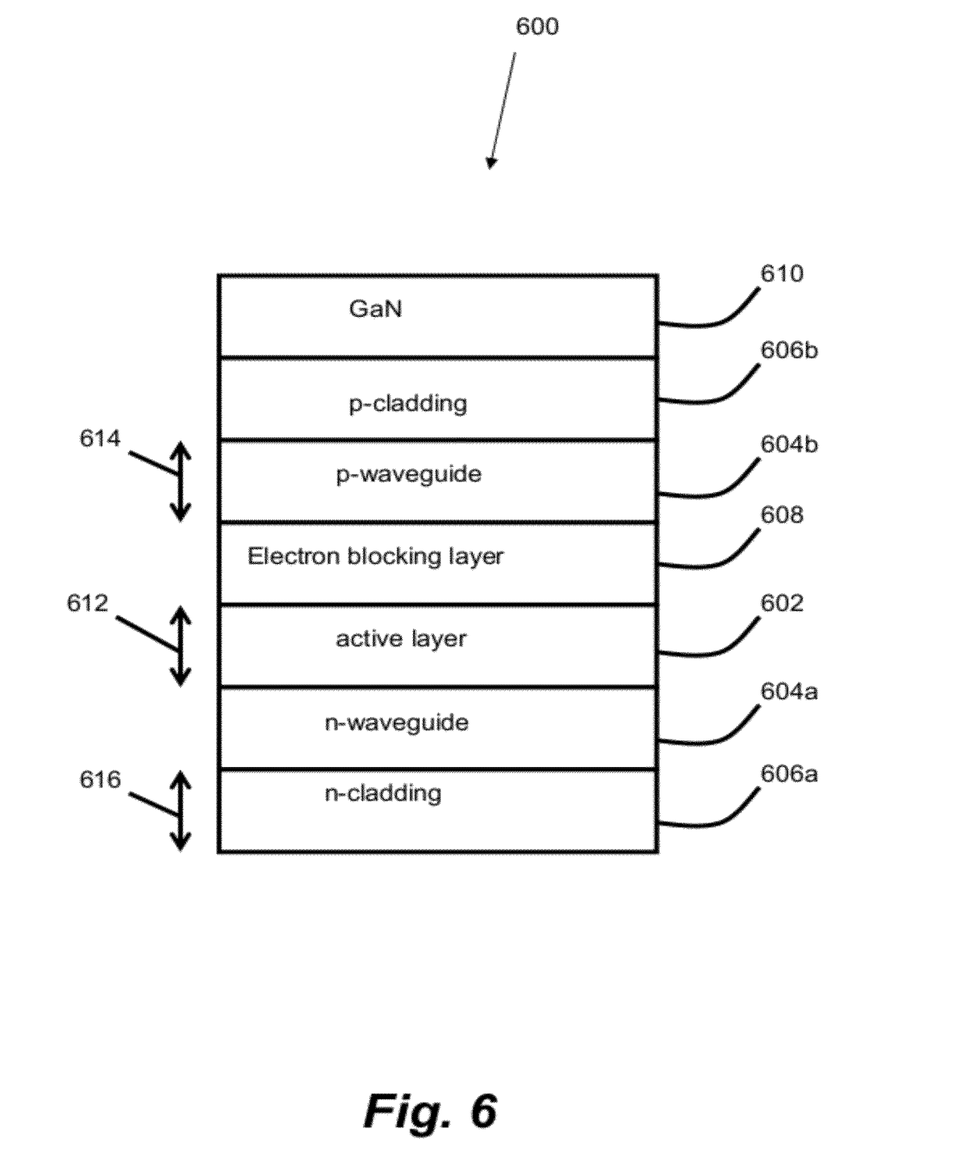
FIG. 6 is a cross-sectional schematic of a device structure grown on the patterned substrate, according to one or more embodiments of the present invention.

FIG. 6 illustrates a device structure 600 comprising device layers that can be deposited on the patterned surface 204, wherein the device structure 600 or device layers are for a non-polar or semi-polar III-nitride Light Emitting Diode (LED) or Laser Diode (LD) emitting light. The device structure 600 includes the heterostructure 500, or layers 500a-b, or one or more active layers 602 emitting light having a peak intensity at one or more wavelengths corresponding to green wavelengths or longer (e.g., yellow or red light), or a peak intensity at a wavelength of 500 nm or longer. The layers 500a-b of the heterostructure 500 can be the active layers 602.

The present invention is not limited to devices emitting at particular wavelengths, and the devices can emit at other wavelengths. The device can be a blue, yellow, or red light emitting device, for example.

The active layer 602 can comprise one or more non-polar or semi-polar III-nitride layers comprising Indium. The nonpolar or semipolar III-nitride device layer 500a-b or active layer 602 can be sufficiently thick, and have sufficiently high Indium composition, such that the light emitting device emits the light having the desired wavelengths. The light emitting active layer(s) 602 can include InGaN layers, e.g., one or more InGaN quantum wells with GaN barriers. The InGaN quantum wells can have an Indium composition of at least 7%, at least 10%, at least 16%, or at least 30%, and a thickness greater than 4 nanometers (e.g., 5 nm), at least 5 nm, or at least 8 nm, for example. However, the quantum well thickness may also be less than 4 nm, although it is typically above 2 nm thickness.

The semipolar or nonpolar III-nitride device layers of the semi-polar or non-polar light emitting device structure 600 can further include n-type waveguiding layers 604a and p-type waveguiding layers 604b and/or n-type cladding layers 606a and p-type cladding 606b layers that are sufficiently thick, and have a composition, to function as waveguiding/cladding layers for the light emitted by the active layers 602 of the LD or LED. The waveguiding layers 604a-b can comprise an indium composition of at least 7%, or at least 30%, for example.

The waveguiding layers 604a, 604b can comprise one or more InGaN quantum wells with GaN barrier layers, and the cladding layers 606a, 606b can comprise one or more periods of alternating AlGaN and GaN layers, for example. The device structure can be AlGaN cladding layer free.

The device structure 600 can further comprise an AlGaN blocking layer 608 and a GaN layer 610. While FIG. 6 illustrates a Laser Diode structure, the structure can be modified as necessary to form a Light Emitting Diode structure.

One or more of the III-nitride semi-polar or non-polar device layers 500a-b can be heterostructures, or layers that are lattice mismatched with, and/or have a different composition from, another of the semi-polar or non-polar III-nitride device layers or the substrate. For example, the device layers can be (Al,In)GaN layers on a GaN substrate. For example, the device layers can be InGaN layer(s) and an AlGaN layer(s), wherein the heterointerface is between the InGaN layer and the AlGaN layer, the InGaN layer and a GaN layer, or an AlGaN layer and a GaN layer.

One or more of the semi-polar or semipolar III-nitride device layers 500a, 500b can have a thickness equal to or greater than their critical thickness on a non-patterned surface 110 of the nonpolar or semipolar III-nitride substrate 102.

The equilibrium critical thickness corresponds to the case when it is energetically favorable to form one misfit dislocation at the layer/substrate interface.

Experimental, or kinetic critical thickness, is always somewhat or significantly larger than the equilibrium critical thickness. However, regardless of whether the critical thickness is the equilibrium or kinetic critical thickness, the critical thickness corresponds to the thickness where a layer transforms from fully coherent to partially relaxed.

Another example of the critical thickness is the Matthews Blakeslee critical thickness [4].

For example, a total thickness 612 of all the active layers 600 (e.g., multi-quantum-well stack thickness) can be equal to, or greater than, the critical thickness for the active layer on a non-patterned surface 110. A total thickness 614 of the n-type or p-type waveguiding layers 604a, 604b can be equal to, or greater than, the critical thickness for the waveguiding layers 604a, 604b on the non-patterned surface 110. A total thickness 616 of the n-type or p-type cladding layers 606a, 606b can be equal to, or greater than, the critical thickness for the cladding layers 606a, 606b on the non-patterned surface 110.

However, using the patterned surface 204, the layers 602, 604a, 604b, and 606b, 606a can be coherently grown. For a layer X grown on a layer Y, for the case of coherent growth, the in-plane lattice constant(s) of X are constrained to be the same as the underlying layer Y. If X is fully relaxed, then the lattice constants of X assume their natural (i.e. in the absence of any strain) value. If X is neither coherent nor fully relaxed with respect to Y, then it is considered to be partially relaxed. In some cases, the substrate might have some residual strain.

Device structures using this method can be different because of the possibility of a wider available device design space (e.g., defect-free coherent structures with higher composition/thicker alloy layers).

One or more of the device layers 500a-b can have a thickness and/or composition that is high enough such that a film, comprising all, or one or more of, the device layers 500a-b, has a thickness near or greater than the film's critical thickness for relaxation on a non-patterned substrate.

One or more of the semipolar or nonpolar III-nitride device layers 500a, 500b can be thicker, and have a higher alloy composition (e.g., more Al, In, and/or B, or non-gallium element), as compared to semi-polar or nonpolar III-nitride device layers that are grown on an a non-patterned, or different patterned surface, of a semi-polar or nonpolar III-nitride substrate or epilayer.

Accordingly, one or more embodiments of the present invention illustrate a method to limit strain relaxation of hetero-epitaxial III-nitride layers 500 grown on a III-nitride substrate or epilayer, comprising patterning the substrate or epilayer; and growing the III-nitride layers 500 on the patterned substrate 202.

Embodiments of the present invention include growing, processing, and/or contacting the device layers 500a, 500b on the patterned surface 204 to fabricate any electronic or optoelectronic device, including, but not limited to, an LED, a transistor, a solar cell, or a LD.

Possible Modifications

The substrate/epilayer can be grown using alternative techniques e.g., Hydride Vapor Phase Epitaxy (HVPE)/Molecular Beam Epitaxy (MBE)/Chemical Vapor Deposition (CVD)/Metal Organic Vapor Deposition (MOCVD)/ammonothermal techniques etc. The process flow for patterning etched mesas can be different—e.g., positive/negative photoresist, various dielectric masks ($SiO_2$, silicon nitride, etc.) can be employed for the etching (e.g., dry/wet etching).

Various etch chemistry and/or cleaning procedures can alternatively be employed.

The device epitaxial re-growth can be performed using a variety/combination of growth techniques—e.g., HVPE, MBE, CVD, MOCVD, or ammonothermal growth, etc. Additionally, if MDs are formed by pyramidal/prismatic slip, then the line direction of the MDs would change accordingly; so the mesa dimensions would have to be modified accordingly. In all cases, l (in Equation 1) corresponds to the TD run length in the glide direction, and is the dimension of consequence.

ADVANTAGES AND IMPROVEMENTS

The present invention is applicable to electronic and optoelectronic devices grown on III-nitride substrates (e.g., LEDs, LDs, solar cells, High Electron Mobility Transistors (HEMTs) etc.)

The invention provides a way to limit stress-relaxation in semipolar III-nitride heteroepitaxy, thus providing an extended device design space incorporating thicker/higher composition alloy epilayers. For LEDs or LDs, an expanded emission wavelength, e.g. green, yellow and red LEDs and LDs can be realized. Significantly improved optical waveguiding can be achieved for LDs by using thicker/higher composition waveguiding and cladding layers.

State of the art semipolar III-nitride devices are grown on as received GaN substrates (typically grown by HVPE with TD density ~$10^6$ cm$^{-2}$). As discussed above, this implies there are enough pre-existing TDs to relieve a misfit stress of ~2%. Alternatively, looking at Equation 1, MD density can also be limited by reducing TD density. In fact, GaN substrates grown by the ammonothermal method with TD density of $5\times10^4$ cm$^{-2}$ have been reported [3]. However, such substrates are not easily available and the TD density strongly depends on the growth techniques and growth conditions. HVPE grown GaN substrates which are commercially available have typical TD density of ~$10^6$ cm$^{-2}$. In contrast, the present invention can be applied to substrates/epilayers with varying degrees of TD density and is thus not limited by pre-existing TD density. Thus, the present invention has fewer constraints and is widely applicable.

REFERENCES

The following references are incorporated by reference herein.

[1] Tyagi et al., Applied Physics Letters 95, 251905 (2009).
[2] Young et al., Applied Physics Express 3, 011004 (2010).
[3] Kucharski et al., Applied Physics Letters 95, 131119 (2009).
[4] J. Matthews and A. Blakeslee, *J. Cryst. Growth* 32 265 (1976).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A semipolar or non-polar III-nitride device, comprising:
   a semipolar or nonpolar III-nitride substrate or epilayer; and
   a heterostructure, comprising semipolar or nonpolar III-nitride device layers, grown on the semipolar or nonpolar III-nitride substrate or epilayer, wherein the heterostructure has a misfit dislocation density of $10^4$ cm$^{-2}$ or less.

2. The device of claim 1, wherein the semipolar or nonpolar III-nitride substrate or epilayer has a threading dislocation density of $10^6$ cm$^{-2}$ or more.

3. The device of claim 1, wherein:
   the semi-polar or non-polar III-nitride device layers form a film having a thickness near or greater than the film's critical thickness for relaxation, and
   the critical thickness is for one or more semi-polar or non-polar III-nitride device layers deposited on a non-patterned surface of a semi-polar or non-polar III-nitride substrate or epilayer.

4. The device of claim 1, wherein:
   the semipolar or nonpolar III-nitride substrate or epilayer comprises one or more mesas with a dimension l along a direction of a threading dislocation glide, thereby forming a patterned surface of the semipolar or nonpolar III-nitride substrate or epilayer, and
   the heterostructure is grown heteroepitaxially and coherently on the patterned surface.

5. The device of claim 4, wherein l is between 10 micrometers and 1 millimeter.

6. The device of claim 4, wherein a heterointerface between the heterostructure and the patterned surface includes a misfit dislocation density that is reduced by a factor of at least 10 as compared to a misfit dislocation density resulting from a semipolar or nonpolar III-nitride heterostructure grown heteroepitaxially and coherently on a non-patterned surface of a semipolar or nonpolar III-nitride substrate or epilayer.

7. The device of claim 4, wherein a heterointerface between the heterostructure and the patterned surface includes a misfit dislocation density that is reduced by a factor of at least 10 as compared to a misfit dislocation density resulting from a semipolar or nonpolar III-nitride heterostructure grown heteroepitaxially and coherently on a non-patterned surface of the semipolar or nonpolar III-nitride substrate or epilayer.

8. The device of claim 4, wherein a heterointerface between the heterostructure and the patterned surface includes a misfit dislocation density that is reduced by a factor of at least 1000 as compared to a misfit dislocation density resulting from a semipolar or nonpolar III-nitride heterostructure grown heteroepitaxially and coherently on a non-patterned surface of a semipolar or nonpolar III-nitride substrate or epilayer.

9. The device of claim 4, wherein:
one or more of the semipolar or nonpolar III-nitride device layers are grown on the patterned surface, and
the one or more semipolar or nonpolar III-nitride device layers are thicker, and have a higher alloy composition, as compared to:
semi-polar or nonpolar III-nitride device layers that are grown on a non-patterned surface of a semi-polar or nonpolar III-nitride substrate or epilayer, or
semi-polar or nonpolar III-nitride device layers that are grown on a different patterned surface of a semipolar or nonpolar III-nitride substrate or epilayer.

10. The device of claim 2, further comprising a device structure on the patterned surface, wherein:
device structure is for a non-polar or semi-polar III-nitride Light Emitting Diode (LED) or Laser Diode (LD), and
the device structure includes the heterostructure and one or more active layers emitting light having a peak intensity at one or more wavelengths corresponding to green wavelengths or longer, or a peak intensity at a wavelength of 500 nm or longer.

11. The device of claim 10, wherein:
the active layers comprise III-nitride Indium containing layers, and the III-nitride Indium containing layers have a thickness and Indium composition wherein the LED or LD emits the light having the wavelengths corresponding to the green wavelengths or longer, or the peak intensity at the wavelength of 500 nm or longer.

12. The device of claim 11, wherein:
the device structure comprises waveguiding layers, comprising III-nitride layers that are sufficiently thick, and have a composition, to function as the waveguiding layers for the LD or LED, or
the device structure comprises waveguiding and cladding layers, comprising III-nitride layers that are sufficiently thick, and have a composition, to function as waveguiding and cladding layers for the LD or LED.

13. The device of claim 12, wherein the active layers and the waveguiding layers comprise one or more InGaN quantum wells with GaN barrier layers, and the cladding layers comprise one or more periods of alternating AlGaN and GaN layers.

14. A method of fabricating a substrate for a semipolar or non-polar III-nitride device, comprising:
patterning and forming one or more mesas on a surface of a semipolar or non-polar III-nitride substrate or epilayer, thereby forming a patterned surface of the semipolar or non-polar III-nitride substrate or epilayer, wherein:
each of the mesas has a dimension l along a direction of a threading dislocation glide, wherein the threading dislocation glide results from a semi-polar or non-polar III-nitride layer deposited heteroepitaxially and coherently on a non-patterned surface of a semi-polar or nonpolar III-nitride substrate or epilayer.

15. The method of claim 14, wherein:
the semi-polar or non-polar III-nitride device layers form a film having a thickness near or greater than the film's critical thickness for relaxation, and
the critical thickness is for one or more semi-polar or non-polar III-nitride device layers deposited on a non-patterned surface of a semi-polar or non-polar III-nitride substrate or epilayer.

16. The method of claim 14, wherein a pre-existing threading dislocation density of the non-polar or semi-polar III-nitride substrate is at least $10^5$ cm$^{-2}$, or between $10^5$ and $10^7$ cm$^{-2}$.

17. The method of claim 14, wherein l is between 10 μm and 1 mm.

18. The method of claim 14, further comprising growing a heterostructure, comprising semi-polar or non-polar III-nitride device layers, coherently on the patterned surface, wherein at least one of the semi-polar or non-polar III-nitride layers has a different III-nitride composition from the nonpolar or semipolar III-nitride substrate or epilayer.

19. The method of claim 18, wherein a heterointerface between the heterostructure and the patterned surface includes a misfit dislocation density that is reduced by a factor of at least 10 as compared to a misfit dislocation density resulting from a semipolar or nonpolar III-nitride heterostructure grown heteroepitaxially and coherently on a non-patterned surface of a semipolar or nonpolar III-nitride substrate or epilayer.

20. The method of claim 18, wherein a heterointerface between the heterostructure and the patterned surface includes a misfit dislocation density that is reduced by a factor of at least 1000 as compared to a misfit dislocation density resulting from a semipolar or nonpolar III-nitride heterostructure grown heteroepitaxially and coherently on a non-patterned surface of a semipolar or nonpolar III-nitride substrate or epilayer.

21. The method of claim 18, wherein:
one or more of the semipolar or nonpolar III-nitride device layers are grown on the patterned surface, and
the one or more of the semipolar or nonpolar III-nitride device layers are thicker, and have a higher alloy composition, as compared to:
semi-polar or nonpolar III-nitride device layers that are grown on an on-axis surface of a semi-polar or non-polar III-nitride substrate or epilayer, or
semi-polar or nonpolar III-nitride device layers that are grown on a different vicinal surface of a semipolar or nonpolar III-nitride substrate or epilayer.

22. The method of claim 18, further comprising growing a device structure, comprising nonpolar or semipolar III-nitride layers for a non-polar or semi-polar III-nitride Light Emitting Diode (LED) or Laser Diode (LD), on the patterned surface, wherein:
the device structure includes the heterostructure and one or more active layers emitting light having a peak intensity at one or more wavelengths corresponding to green wavelengths or longer, or a peak intensity at a wavelength of 500 nm or longer.

23. The method of claim 22, wherein:
the active layers comprise III-nitride Indium containing layers; and
the III-nitride Indium containing layers have a thickness; and Indium composition wherein the LED or LD emits the light having the wavelengths corresponding to the green wavelengths or longer, or the peak intensity at the wavelength of 500 nm or longer.

24. The method of claim 23, wherein:
the device structure comprises waveguiding layers, comprising III-nitride layers that are sufficiently thick, and have a composition, to function as the waveguiding layers for the LD or LED, or
the device structure comprises waveguiding and cladding layers, comprising III-nitride layers that are sufficiently thick, and have a composition, to function as waveguiding and cladding layers for the LD or LED.

25. The method of claim 24, wherein the active layers and the waveguiding layers comprise one or more InGaN quantum wells with GaN barrier layers, and the cladding layers comprise one or more periods of alternating AlGaN and GaN layers.

26. A substrate for a semipolar III-nitride device, comprising:
- one or more mesas on a surface of a semipolar III-nitride substrate or epilayer, forming a patterned surface of the semipolar III-nitride substrate or epilayer, wherein:
- each of the mesas includes a dimension l along a direction of a threading dislocation glide wherein semipolar or nonpolar III-nitride device layers, grown on the semipolar or nonpolar III-nitride substrate or epilayer, have a misfit dislocation density of $10^4$ cm$^{-2}$ or less.

* * * * *